United States Patent [19]

Delfino

[11] Patent Number: 4,542,037
[45] Date of Patent: Sep. 17, 1985

[54] LASER INDUCED FLOW OF GLASS BONDED MATERIALS

[75] Inventor: Michelangelo Delfino, Mountain View, Calif.

[73] Assignee: Fairchild Camera and Instrument Corporation, Mountain View, Calif.

[21] Appl. No.: 300,706

[22] Filed: Jun. 30, 1981

Related U.S. Application Data

[63] Continuation of Ser. No. 143,983, Apr. 28, 1980, abandoned.

[51] Int. Cl.³ .............................................. B05D 3/06
[52] U.S. Cl. .............................. 427/53.1; 219/121 LE
[58] Field of Search .................. 65/54, 65, 104, 111, 65/139, DIG. 4; 427/53.1; 219/121 LE, 121 LF

[56] References Cited

U.S. PATENT DOCUMENTS

| | | | |
|---|---|---|---|
| 3,825,442 | 7/1974 | Moore | 427/85 |
| 3,920,483 | 11/1975 | Johnson et al. | 65/DIG. 4 |
| 4,025,328 | 5/1977 | Polaert et al. | 65/DIG. 4 |
| 4,122,240 | 10/1978 | Banas et al. | 427/53.1 |
| 4,151,008 | 4/1979 | Kirkpatrick | |
| 4,159,686 | 7/1979 | Heim | 219/121 LF |
| 4,258,078 | 3/1981 | Celler et al. | 219/121 LF |
| 4,284,659 | 8/1981 | Jaccodine et al. | 427/53.1 |

FOREIGN PATENT DOCUMENTS

| | | |
|---|---|---|
| 8928 | 3/1980 | European Pat. Off. . |
| 2040180 | 7/1971 | Fed. Rep. of Germany . |
| WO80/1121 | 5/1980 | PCT Int'l Appl. . |
| 1494708 | 12/1977 | United Kingdom . |
| 2044533 | 10/1980 | United Kingdom . |

OTHER PUBLICATIONS

Saifi et al., "Ceramic Bulletin", vol. 52, No. 11, (1973), pp. 838-841.
Arecchi et al., *Laser Handbook*, vol. 2, (1972), North-Holland Publishing Co., NY, pp. 1577-1632.
Kaplan et al., *Electronics*, Feb. 1980, pp. 137-142.
Brown et al., *Bell Laboratories Record*, Jul./Aug. 1979, pp. 187-191.
Huang et al., *IBM Tech. Disc. Bull.*, Feb. 1968, pp. 1359, 1360.

*Primary Examiner*—John H. Newsome
*Attorney, Agent, or Firm*—Carl Silverman; David H. Carroll; Alan H. MacPherson

[57] ABSTRACT

A tunable $CO_2$ gas laser is used to selectively heat various $SiO_2$-based materials to elevated temperatures while maintaining an active device region at relatively low temperatures, to, for example, induce densification and/or flow of the $SiO_2$-based material to round off sharp edges and stops.

47 Claims, 6 Drawing Figures

LASER INDUCED FLOW OF GLASS BONDED MATERIALS

This is a continuation of application Ser. No. 143,983 filed Apr. 28, 1980, abandoned.

BACKGROUND OF THE INVENTION

This invention relates to heating of $SiO_2$-based material in the semiconductor art.

The phosphosilicate glass flow process is used primarily to round off sharp edges of etched cuts on phosphosilicate glass to help prevent cracking at the edges of subsequently deposited metal or polycrystalline silicon fill and also to smooth the overall surface of a layer of phosphosilicate glass for subsequent controlled etching thereof. The flow process is normally induced by high temperature (approximately 950° C. or above) furnace anneal.

In general, the phosphosilicate glass layer is part of a structure initially formed by providing a silicon substrate with a thermally deposited silicon dioxide ($SiO_2$) layer thereon. A layer of $P_2O_5$-$SiO_2$ is then chemically vapor deposited on the layer of thermally deposited $SiO_2$ by, for example, reaction of a phosphorous-silane mixture and oxygen at low temperature, so that a top layer of phosphosilicate glass is provided.

A major problem with the prior art approach of inducing flow by high temperature anneal is that when device structures, i.e., structures which may be of material in close proximity to the phosphosilicate glass, are heated to a relatively high temperature in the furnace, their properties often undesirably change due to dopant diffusion, alloying and contamination. Another problem is that $P_2O_5$, typically in the concentration of 7-9 mol %, must be added to the $SiO_2$ base composition to lower the flow temperature. This subsequently enhances corrosion of the metal interconnections.

SUMMARY OF THE INVENTION

It is accordingly an object of the invention to provide a highly efficient method of inducing densification and/or flow of phophosilicate glass or the like so as to overcome the problems set forth above.

Broadly stated, the invention comprises a method of inducing flow or densification of a first, $SiO_2$-based portion of a structure in close proximity to a second portion of the structure, the first portion being of the type wherein flow or densification is induced therein upon application of heat thereto, comprising heating the first portion to an extent substantially greater than the second portion.

Broadly stated, the invention also comprises a method of inducing flow or densification of a first portion of a structure in close proximity to a second portion thereof and of the type wherein flow or densification is induced therein upon application of heat thereto, comprising applying a laser beam to the first portion to heat the first portion.

BRIEF DESCRIPTION OF THE DRAWINGS

Other objects will become apparent from a study of the following specification and drawings, wherein.

DESCRIPTION OF THE PREFERRED EMBODIMENT

Figure 1:
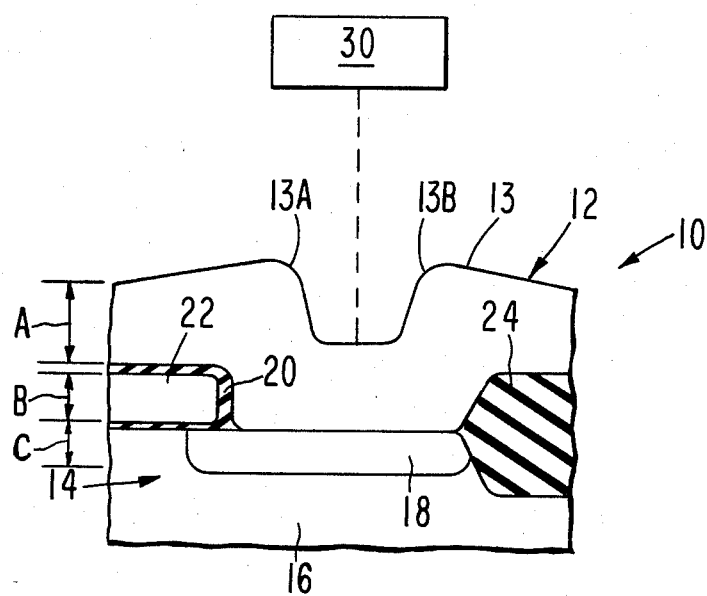
FIG. 1 is a schematic cross section of a semiconductor structure being treated with a laser beam.

As explained above, FIGS. 1-5 illustrate the steps of the present invention. As shown in FIG. 1, a semiconductor structure 10 typified by an MOS device includes a first, $SiO_2$-based portion 12 which is in the form of vapor deposited silicon oxide, grown phosphosilicate glass, which is in close proximity to a second structure portion 14. The second portion includes a silicon substrate 16 having a source/drain portion 18 formed therein, an oxide region 20, and a polycrystalline silicon interconnect 22. Isolation oxide 24 is also included. Typically, the direction "A" may be of the order of 1.0-1.5 $\mu$m, the dimension "B" may be of the order of 0.4 $\mu$m-0.6 $\mu$m, and the dimension "C" may be of the order of 0.4 $\mu$m-0.6 $\mu$m.

As described above, and as will be further described, it is desirable to apply heat to the phosphosilicate glass 12 to induce densification and/or flow thereof. As also discussed above, it will be seen that it is desirable to maintain the portion 14 at a relatively low temperature so as to avoid undesired dopant diffusion, alloying, and/or contamination.

The basis for the present process is the $SiO_2$ absorption maxima centered at about 1080 $cm^{-1}$ (approximately 240 $cm^{-1}$ band width FWHM) with an absorption coefficient of about $3 \times 10^4$ $cm^{-1}$. This absorption band is well suited for coupling to the 9.261 $\mu$m (1080 $cm^{-1}$) emission of a suitable $CO_2$ scanning laser as shown at 30, which may be for example a Model 560 $CO_2$ gas laser as manufactured by Apollo Lasers, Inc., 6357 Arizona Circle, Los Angeles, CA 90045. For the composition $SiO_2$ up to 20 mol % $P_2O_5$, the 1080 $cm^{-1}$ absorption band decreased monotonically with an increase in mol % of $P_2O_5$. Comparable concentrations of $B_2O_3$, $As_2O_5$ or $Sb_2O_5$ in $SiO_2$ will exhibit similar absorption characteristics. Additions of $Si_3S_4$ to $SiO_2$ will also behave similarly. Thus, any $SiO_2$ based material with a greater than approximately 80 mol % $SiO_2$, whether it be crystalline or amorphous, can be effectively coupled to the output of a $CO_2$ gas laser, and preferably one which is tunable.

At the wavelength under consideration, metallization has exhibited reflecting losses greater than about 95%, so that essentially no heat conduction thereby takes place. Also, the large thermal conductivity of metallization will act as a heat sink, pulling heat away from the active device. For silicon such as the substrate material 16, absorption occurs via photoexcitation of free carriers with a small contribution due to multi-phonon excitation. The absorption is in proportion to the dopant concentration and inversely proportional to the carrier mobility. Therefore, the coupling efficiency is significantly lower for both metal and silicon relative to $SiO_2$-based material 12.

The temperature T in a solid heated by a laser beam of incident intensity $I_o$ is given [1] as:

$$T = D\nabla^2 T + \frac{I_o(I - R)}{\rho C_p} \alpha \exp(-\alpha \cdot Z) \quad [1]$$

where D is the thermal diffusivity, $\rho$ is the mass density, $C_p$ is the specific heat, R is the reflectivity, $\alpha$ is the absorption coefficient, Z is the coordinate parallel to the incident radiation, and $$\nabla^2 T = \frac{\partial^2 T}{\partial X^2} + \frac{\partial^2 T}{\partial Y^2} + \frac{\partial^2 T}{\partial Z^2}$$

where X, Y and Z are the cartesian coordinates of the solid. In the case of laser induced phosphosilicate glass flow, $\alpha^{-1} << (2Dt)^{\frac{1}{2}}$, so that heat is created essentially at the surface and transported into the bulk by heat conduction. Assuming D, $C_p$, and R to be temperature invariant, I to be spatially and temporally uniform, and that no latent heat due to phase transitions is involved, the solution to Eq. [1] is:

$$T(Z,t) = T_o + \frac{I_o(I - R)}{\rho C_p} \left(\frac{t}{D}\right)^{\frac{1}{2}} 2 \, i \, erfc \frac{Z}{2(Dt)^{\frac{1}{2}}} \quad [2]$$

where $T_o$ is the initial temperature, and T(Z,t) is the temperature at a point Z and time, $0 \leq t \leq t_f$, where $t_f$ is the pulse width or the dwell time of the incident radiation.

Figure 6:
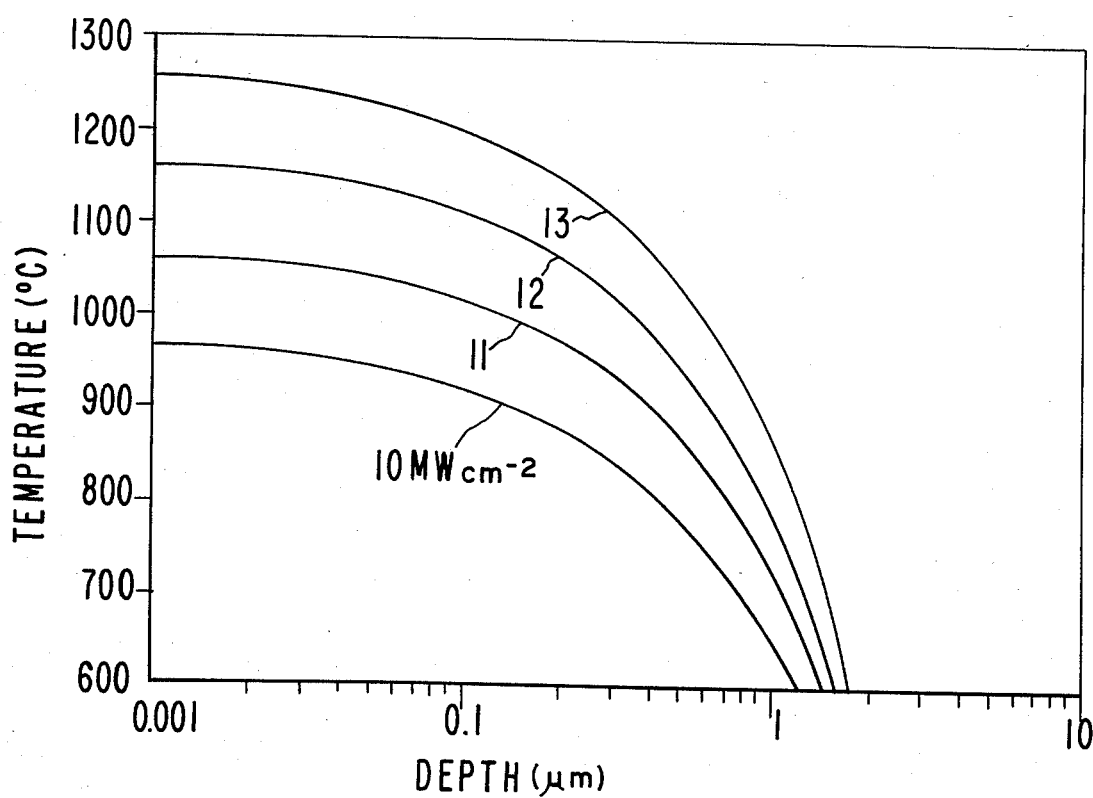
FIG. 6 is a graphical view of a theoretical temperature profile of phosphosilicate glass as a function of incident power density for a $10^{-3}$ second laser pulse or dwell time corresponding to pulsed or Q-switched and continuous wave (CW) laser modes, respectively.

For phosphosilicate glass, the following material constants are assumed:
$D = 6 \times 10^{-3}$ cm$^2$ sec$^{-1}$
$\rho = 2.27$ g cm$^{-3}$
$C_p = 1.0$ J g$^{-1}$ °C.$^{-1}$
$R = 0.525$ Under these conditions, in FIG. 6 is plotted the calculated temperature profile, $T(Z,t) - T_o$ as a function of Z, for t=0.001 sec and $I_o$=10, 11, 12 and 13 MW cm$^{-2}$. These curves suggest that for phosphosilicate glass thicknesses greater than about 1 $\mu$m, large thermal gradients will exist which maintain the surface of the substrate at a relatively cool temperature during flow. Within the normal phosphosilicate glass thickness range of 0.5 to 1.5 $\mu$m, FIG. 2 suggests that maximum phosphosilicate glass thickness will be optimal for this purpose and that a significant increase in thickness will not be beneficial. In support of this, consider that 12 MW cm$^{-2}$ will produce a surface temperature of 1156° whereas the temperature at depths of 0.98, 1.47, and 2.45 $\mu$m will be 792°, 664° C., and 409° C., respectively. The underlying portion 14 is then never subjected to elevated temperatures.

If the substrate is heated, it will be noted that $T_o$ is increased, and the power density necessary to provide a certain $T(Z,t) - T_o$ decreases.

It should be recognized that the present method has the most significant advantage that the portion 12 can be induced to flow and/or densify by application of heat thereto through use of the laser 30, but with it being understood that the portion 12 is heated to an extent substantially greater than the portion 14. As discussed above, it will be seen that the surface of the phosphosilicate glass 12 can be heated to an elevated temperature, whereas the phosphosilicate glass at a depth of about 1.47 $\mu$m will be heated to a much lower temperature.

The result of the method described above is shown in FIG. 2. It will be seen that a great degree of smoothing of the surface 13 of the phosphosilicate glass 12 has been achieved. This is highly desirable for purposes of etching since the placement of the etching window defined by well-known photoresist techniques can be accurately achieved. This is to be compared with FIG. 1, wherein, if etching was to take place without such flow, the photoresist edges would have to be placed approximately where the "shoulders" 13A, 13B are defined by the phosphosilicate glass 12. Also, because of the relatively smooth shape of the phosphosilicate glass 12 as shown in FIG. 2, the etching can be controlled as chosen to a higher degree.

Figure 2:
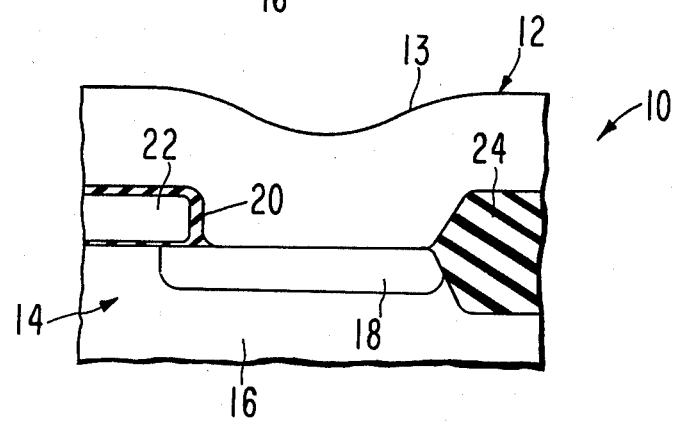
FIG. 2 is a view similar to FIG. 1 but showing a smooth cavity in the surface of the semiconductor structure.
Figure 3:
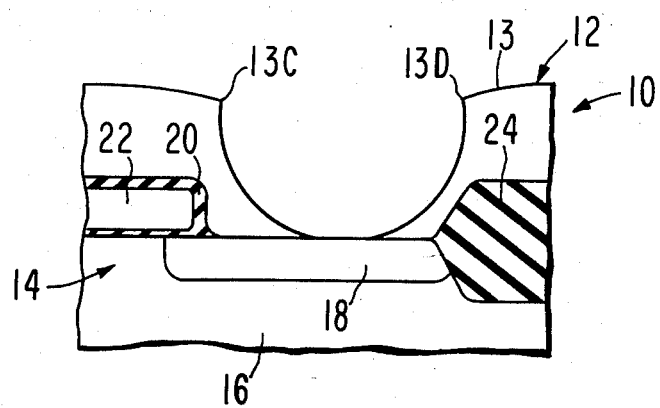
FIG. 3 is a view similar to FIGS. 1 and 2 but showing the surface of the semiconductor structure after the structure of FIG. 2 has been etched to form a concavity with sharp edges.

The result of such etching of the FIG. 2 structure is shown in FIG. 3. It is to be noted that while etching down to the substrate 16 in the chosen place and in the chosen manner has been achieved, sharp corners 13C, 13D are now defined by the phosphosilicate glass 12. The process as described above is again undertaken in the same manner, causing the phosphosilicate glass 12 to again flow, so as to smooth all the phosphosilicate glass surface 13 as shown in FIG. 3, and in particular to smooth the corners 13C, 13D shown in FIG. 3. The resulting structure is shown in FIG. 4.

Figure 4:
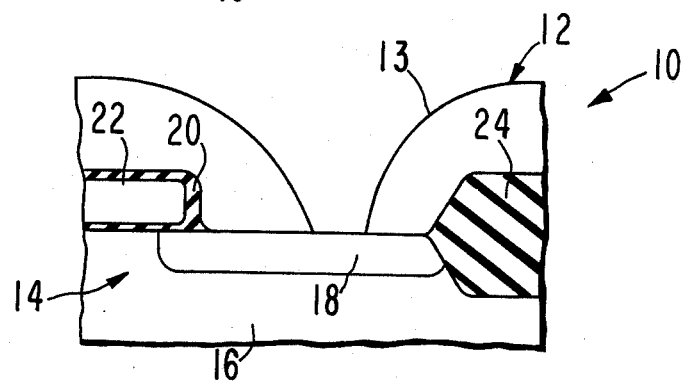
FIG. 4 is a view similar to FIG. 3, but showing the concavity after being heated with a laser beam to smooth the sharp edges of the concavity.
Figure 5:
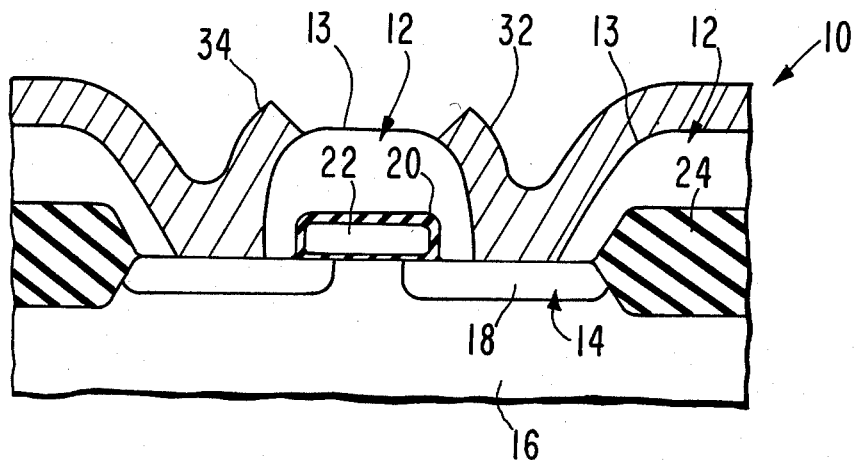
FIG. 5 is a view similar to FIGS. 1-4 but showing a complete device with metal contacts deposited over the smooth edges.

The smoothing of the phosphosilicate glass 12 into the form shown in FIG. 4 allows for the proper placement of the aluminum leads 32, 34 as shown in FIG. 5, it being noted that FIGS. 1 through 4 have in fact shown the process as undertaken on the right-hand half of the structure of FIG. 5, which will readily be seen to be an MOS device. It is thus insured that cracking of the aluminum leads 32, 34 will not take place.

It is to be understood that although an MOS structure is shown in the illustration of the present process, such process can readily be used in bipolar structures. As also discussed above, the process is intrinsically independent of the mol % of $P_2O_5$, $As_2O_5$, or $B_2O_3$ up to about 20 mol %.

Through the use of a laser as described above, it will also be seen that extremely small areas can be made to flow as desired.

I claim:

1. A method of inducing flow or densification of a first silicon-oxygen bonded glass portion of an integrated circuit structure in close proximity to a second portion of the structure containing different material the first portion being of the type wherein flow or densification is induced therein upon application of heat thereto, comprising heating the first portion, by a laser beam having an emission coupled to the absorption band of said silicon-oxygen bonded glass, to an extent substantially greater than the second portion.

2. The method of claim 1 wherein the first portion is provided as phosphosilicate glass.

3. The method of claim 2 wherein at least a part of the second portion is provided as metal.

4. The method of claim 1 and comprising the step of providing a $CO_2$ laser to apply the laser beam.

5. The method of claim 4 and further comprising the step of providing a tunable $CO_2$ laser.

6. The method of claim 1 wherein the first portion is provided as vapor deposited silicon oxide grown phosphosilicate glass.

7. The method of claim 1 further providing greater selective absorption of laser radiation by the first portion than the second portion.

8. The method of claim 1 wherein the first portion is provided as borosilicate glass.

9. The method of claim 1 wherein the first portion is provided as silicon-oxynitride glass.

10. A method of working a selected area of an integrated circuit structure comprising a first portion in close proximity to a second portion of the structure, the first portion comprising silicon-oxygen bonded material to provide a smooth transition in contour in the silicon-oxygen bonded material; the method comprising the steps of:
(A) focusing a laser beam on the selected area, the laser beam having an emission which couples with the light absorption band of the silicon-oxygen bonded material;
(B) controlling the duration and intensity of the beam to heat the selected area to a temperature sufficient to flow or densify the silicon-oxygen bonded material of the selected area but not sufficient to vaporize the silicon-oxygen bonded material of the selected area whereby silicon-oxygen bonded material in the first portion is flowed or densified without substantially raising the temperature of the second portion;
(C) terminating application of the laser beam when the desired smooth transition in contour is achieved and
(D) etching the silicon-oxygen bonded material to form an etched area with an abrupt edge and thereafter performing Steps A through C to flow or densify material at the abrupt edge area.

11. The method of claim 10 wherein the silicon-oxygen bonded material is provided as chemically vapor deposited phososilicate glass.

12. The method of claim 10 wherein a $CO_2$ laser is used to apply the laser beam.

13. The method of claim 12 wherein the $CO_2$ laser is tunable.

14. The method of claim 13 wherein the silicon-oxygen bonded material is provided as chemically vapor deposited phosphosilicate glass.

15. A method of working a selected area of an integrated circuit structure comprising a first portion in close proximity to a second portion of the structure, the first portion comprising silicon-oxygen bonded material to provide a smooth transition in contour in the silicon-oxygen bonded material; the method comprising the steps of:
(A) focusing a $CO_2$ laser beam on the selected area, the $CO_2$ laser beam having an emission which couples with the light absorption band of the silicon-oxygen bonded material;
(B) controlling the duration and intensity of the beam to heat the selected area to a temperature sufficient to flow or densify the silicon-oxygen bonded material of the selected area to form a smooth concavity therein but not sufficient to vaporize the silicon-oxygen bonded material of the selected area whereby material in the first portion is flowed or densified without substantially raising the temperature of the second portion;
(C) terminating application of the $CO_2$ laser beam when a desired smooth concavity is achieved;
(D) etching the silicon-oxygen bonded material out from beneath the smooth concavity to form a concavity with an abrupt edge and to expose the second portion;
(E) focusing a $CO_2$ laser beam in the area of the etched concavity, the $CO_2$ laser beam having an emission which couples with the light absorption band of the silicon-oxygen bonded material;
(F) controlling the duration and intensity of the beam to heat the area of the etched concavity to a temperature sufficient to flow or densify the silicon-oxygen bonded material of the area of the etched concavity but not sufficient to vaporize the silicon-oxygen bonded material whereby silicon-oxygen bonded material in the first portion is flowed or densified without substantially raising the temperature of the second portion;
(G) terminating application of the $CO_2$ laser beam when a desired smooth transition in contour of silicon-oxygen bonded material is achieved, and
(H) depositing a contact layer in the now smoothed concavity and in contact with the second portion.

16. The method of claim 15 wherein the first portion is provided as chemically vapor deposited phosphosilicate glass.

17. The method of claim 15 wherein a $CO_2$ laser is used to apply the laser beam.

18. The method of claim 17 wherein the $CO_2$ laser is tunable.

19. The method of claim 18 wherein the first portion is provided as chemically vapor deposited phosphosilicate glass.

20. A method of working a selected area of an integrated circuit structure comprising a first portion in close proximity to a second portion of the structure, the first portion comprising silicon-oxygen bonded material, the method comprising:
(A) focusing a laser beam on the selected area, the laser beam having an emission which couples with the light absorption band of the silicon-oxygen bonded material;
(B) controlling the duration and intensity of the beam to heat the selected area to a temperature sufficient to flow or densify the silicon-oxygen bonded material of the selected area but not sufficient to vaporize the silicon-oxygen bonded material of the selected area whereby silicon-oxygen bonded material in the first portion is flowed or densified without substantially raising the temperature of the second portion;
(C) terminating application of the laser beam when a desired smooth transition in contour of silicon-oxygen bonded material is achieved; and
(D) etching the silicon-oxygen bonded material in said selected area.

21. The method of claim 20 wherein the first portion is provided as chemically vapor deposited phosphosilicate glass.

22. The method of claim 20 wherein a $CO_2$ laser is used to apply the laser beam.

23. The method of claim 22 wherein the $CO_2$ laser is tunable.

24. The method of claim 23 wherein the first portion is provided as chemically vapor deposited phosphosilicate glass.

25. A method of working an area of an integrated circuit structure comprising a first portion in close proximity to a second portion of the structure, the first portion comprising silicon-oxygen bonded material, the method comprising:

(A) etching a selected area of the silicon-oxygen bonded material;

(B) focusing a laser beam on the selected area, the laser beam having an emission which couples with the light absorption band of the silicon-oxygen bonded material;

(C) controlling the duration and intensity of the beam to heat the selected area to a temperature sufficient to flow or densify the silicon-oxygen bonded material of the selected area but not sufficient to vaporize the silicon-oxygen bonded material of the selected area whereby silicon-oxygen bonded material in the first portion is flowed or densified without substantially raising the temperature of the second portion; and (D) terminating application of the laser beam when a desired smooth transition in contour of the silicon-oxygen bonded material is achieved.

26. The method of claim 25 wherein the silicon-oxygen bonded material is provided as chemically vapor deposited phosphosilicate glass.

27. The method of claim 25 wherein a $CO_2$ laser is used to apply the laser beam.

28. The method of claim 27 wherein the $CO_2$ laser is tunable.

29. The method of claim 28 wherein the first portion is provided as chemically vapor deposited phosphosilicate glass.

30. A method of inducing flow or densification of a first portion of an integrated circuit structure in close proximity to a second portion of the integrated circuit structure, the first portion comprising silicon-oxygen bonded material having an absorption maxima centered at approximately 1080 $cm^{-1}$ and an absorption coefficient of about $3 \times 10^4$ $cm^{-1}$, the method comprising the steps of inducing flow or densification of the silicon-oxygen bonded material by focusing the beam of a $CO_2$ scanning laser thereon while minimizing heat transfer to the second portion in order to minimize diffusion, alloying and contamination of the second portion.

31. The method of claim 30 wherein the silicon-oxygen bonded material is greater than 80 mol% silicon dioxide with the remainder of the material consisting of at least one compound from the group: $P_2O_5, B_2O_3, As_2O_5, Sb_2O_5$ and $Si_3N_4$.

32. The method of claim 30 or 31 wherein the first portion has a thickness in the range of 0.5 to 1.5 μm.

33. A method of forming an interlevel glass dielectric layer in a semiconductor device, comprising the steps of:
depositing a layer of glass dielectric material on a partially completed semiconductor device;
forming feed-through apertures in the glass dielectric material; and
exposing the apertured glass dielectric layer to high energy laser radiation which is selectively coupled to said layer to reflow the layer to form a smooth surface topography around said apertures without substantially heating said partially completed semiconductor device.

34. The method as set forth in claim 33, wherein the exposing step is accomplished by: continuously scanning a laser beam over the surface of the apertured dielectric layer.

35. The method as set forth in claim 33, wherein the dielectric layer is phosphorous doped silicate glass.

36. The method as set forth in claim 34, wherein:
the laser scanning step is accomplished with a beam from a CW $CO^2$ laser.

37. The method as set forth in claim 35, wherein the glass depositing step is accomplished by chemical vapor deposition.

38. The method as set forth in claim 37, wherein: the step of continuously scanning a laser beam simultaneously consolidates the vapor deposited dielectric glass layer and forms a smooth surface topography about said feed-through apertures.

39. The method as set forth in claim 33, wherein substantially all of the high energy radiation is absorbed by the dielectric material.

40. The method as set forth in claim 38, which further comprises the step of:
depositing a conductive material on the glass layer which electrically connects the surfaces of the semiconductor exposed through said feed-through apertures.

41. A method of forming a glass dielectric layer in a semiconductor device, comprising the steps of:
vapor depositing a layer of phosphorous doped silica glass on the surface of a semiconductor device;
forming feed-through apertures in the glass layer; and
raster scanning a high energy laser beam over the apertured glass layer to simultaneously densify the vapor deposited glass layer and form a smooth surface topography about said feed-through apertures without substantially heating and thereby altering the properties of said semiconductor device therebelow.

42. A method of inducing flow or densification of a first portion of an integrated circuit structure, said first portion comprising a first material selected from the group of glass material and silicon-oxygen bonded material, in close proximity to a second portion thereof containing a second different material, said first portion being of the type wherein flow or densification is induced therein upon application of heat thereto, comprising applying a laser beam to said first portion to heat said first portion wherein said laser beam has an emission wavelength which is approximately equal to the wavelength most absorbed by said first material and said emission wavelength is not equal to the wavelength most absorbed by said second material.

43. The method of claim 42 wherein said laser beam is provided by a tunable $CO_2$ laser.

44. The method of claim 42, wherein said laser beam has a wavelength in the range of 9 to 11 microns.

45. The method of claim 42 in which said first portion is a silicon-oxygen bonded glass.

46. The method as set forth in claim 34, wherein the dielectric layer is phosphorous doped silicate glass.

47. The method as set forth in claim 34, wherein substantially all of the high energy radiation is absorbed by the dielectric material.

* * * * *

UNITED STATES PATENT AND TRADEMARK OFFICE
CERTIFICATE OF CORRECTION

PATENT NO. : 4,542,037

DATED : September 17, 1985

INVENTOR(S) : Michelangelo Delfino

It is certified that error appears in the above—identified patent and that said Letters Patent is hereby corrected as shown below:

Column 1, line 43, delete "phophosilicate" and insert
--phosphosilicate--.

Column 5, line 37, delete "phososilicate" and insert
--phosphosilicate--.

Signed and Sealed this

Eighteenth Day of February 1986

[SEAL]

Attest:

DONALD J. QUIGG

Attesting Officer

Commissioner of Patents and Trademarks